United States Patent
Pasqualini

(10) Patent No.: US 6,492,855 B1
(45) Date of Patent: Dec. 10, 2002

(54) FLIP FLOP WHICH HAS COMPLEMENTARY, SYMMETRIC, MINIMAL TIMING SKEW OUTPUTS

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/950,207

(22) Filed: Sep. 10, 2001

(51) Int. Cl.[7] .............................................. H03K 3/356
(52) U.S. Cl. ...................................... 327/211; 327/212
(58) Field of Search ................................ 327/199–203, 327/206, 208, 210–215, 218, 219

(56) References Cited

U.S. PATENT DOCUMENTS 5,598,120 A * 1/1997 Yurash ........................ 327/144
6,064,246 A * 5/2000 Endo et al. .................. 327/202
6,127,867 A * 10/2000 Coughlin et al. ............ 327/202
6,239,640 B1 * 5/2001 Liao et al. ................... 327/211
6,242,958 B1 * 6/2001 Fletcher ...................... 327/201

* cited by examiner

*Primary Examiner*—My-Trang Nu Ton
(74) *Attorney, Agent, or Firm*—Mark C. Pickering

(57) ABSTRACT

The complementary outputs of a master slave flip flop are made symmetric, with substantially zero timing skew over all process, voltage and temperature conditions. This is accomplished by utilizing a master latch and a pair of identical slave latches. Although the complementary outputs from the master latch have non-zero timing skew when the clock goes low, they have zero timing skew when the clock goes high. Thus the identical slave latches, whose outputs react to the master latch outputs only when the clock goes high, do not have any timing skew.

26 Claims, 5 Drawing Sheets

FLIP FLOP WHICH HAS COMPLEMENTARY, SYMMETRIC, MINIMAL TIMING SKEW OUTPUTS

BACKGROUND OF THE INVENTION

1. Field of the Invention

The present invention relates to flip flops and, more particularly, to a flip flop which has complementary, symmetric, minimal timing skew outputs.

2. Description of the Related Art

A flip flop is a device which latches the logic state of a data input signal when a predetermined edge of a clock input signal is detected. As a result, a flip flop generates a flop data output signal whose logic state matches the logic state of the data input signal when the predetermined edge of the clock input signal is detected. Additionally, flip flops typically contain a second data output signal whose logic state is the complement (logical inverse) of the first data output signal.

If a flip flop has true/complementary data outputs which are exact mirror images of each other in the time domain, these outputs are said to be complementary and symmetric. Therefore, the rise time of the true data output signal and the fall time of the complementary data output signal must be equal, and the fall time of the true data output signal and the rise time of the complementary data output signal must also be equal. As a result, the flop true/complementary data outputs must change state at exactly the same time, such that both of them will reach the power supply mid-point voltage at exactly the same time.

FIG. 1 shows a timing diagram which illustrates the operation of a flip flop that has complementary, symmetric outputs. As shown in FIG. 1, the flip flop generates a data output signal Q and a complementary data output signal QZ. In addition, the Q and QZ data outputs have equal rise and fall times (equal to two time units). Furthermore, the Q and QZ data outputs change state at exactly the same time, so that they reach the power supply mid-point voltage VDD/2 at exactly the same time.

Many applications require the use of flip flops which have complementary, symmetric outputs. High accuracy digital-to-analog converters (DACs) are an important example. High accuracy DACs are used in a wide variety of applications, including telecommunications, control systems and filters for digital signal processors.

FIG. 2 shows a schematic diagram which illustrates a conventional digital-to-analog interface 200 for one bit of a high-accuracy differential DAC. As shown in FIG. 2, interface 200 includes a flip flop FF1 which has a data input 210 that receives a data signal DATA, and a clock input 212 that receives a clock signal CLK. Flip flop FF1 also has complementary, symmetric outputs which include a data output 214 that generates a flop signal Q, and a complementary data output 216 that generates a complementary flop signal QZ.

Referring to FIG. 2, interface 200 also includes a pair of p-channel load transistors M1 and M2, a pair of differential input transistors M3 and M4, and a current source I. P-channel transistors Ml and M2 both have sources connected to a power supply voltage VDD. In addition, transistor M1 has a gate and a drain connected to a first output node N1, while transistor M2 has a gate and a drain connected to a second output node N2.

N-channel transistors M3 and M4 both have sources connected to current source I which, in turn, is connected to ground. In addition, transistor M3 has a gate connected to data output 214 and a drain connected to first output node N1, while transistor M4 has a gate connected to data output 216 and a drain connected to second output node N2. A differential output is taken across output nodes N1 and N2.

In order to maintain high DAC accuracy, the complementary flop output signals Q and QZ must be mirror images of each other in the time domain. In other words, their rise and fall times must be equal to each other, and they must change state at exactly the same time.

When these conditions are met, the rising and falling waveforms of Q and QZ will cross each other at exactly one half of the power supply voltage (VDD/2), thereby producing an undistorted differential output waveform at nodes N1 and N2.

FIG. 3 shows the schematic diagram of a prior art flip flop 300. Referring to FIG. 3, flop 300 has a clock inverter U1, a master latch 310, and a slave latch 312. Clock inverter U1 has an input connected to an external clock input 314 to receive a clock signal CLK, and an output which generates an inverted clock signal CPZ.

Master latch 310 includes a first transmission gate 316 and a second transmission gate 318. First transmission gate 316 includes an n-channel transistor M1 which has a drain connected to an external data input 320 to receive a data signal D, a source, and a gate connected to the output of clock inverter U1 to receive the inverted clock signal CPZ.

First transmission gate 316 also includes a p-channel transistor M2 which has a source connected to external data input 320 to receive the data signal D, a drain connected to the source of transistor M1, and a gate connected to external clock input 314 to receive the clock signal CLK.

Second transmission gate 318 includes an n-channel transistor M3 which has a drain, a source connected to the source of transistor M1, and a gate connected to external clock input 314 to receive the clock signal CLK. Second transmission gate 318 also includes a p-channel transistor M4 which has a source connected to the drain of transistor M3, a drain connected to the source of transistor M3, and a gate connected to the output of clock inverter U1 to receive the inverted clock signal CPZ.

In addition to first and second transmission gates 316 and 318, master latch 310 also includes an inverter U2 which has an input connected to the source of transistor M1, and an output which generates a latched signal QM. Master latch 310 additionally includes an inverter U3 which has an input connected to the output of inverter U2, and an output which is connected to the drain of transistor M3.

Slave latch 312 includes a third transmission gate 324 and a fourth transmission gate 326. Third transmission gate 324 includes an n-channel transistor M5 and a p-channel transistor M6. Transistor M5 has a drain connected to the output of inverter U2 to receive the latched signal QM, a source, and a gate connected to external clock input 314 to receive the clock signal CLK. Transistor M6 has a source connected to the output of inverter U2 to receive the latched signal QM, a drain connected to the source of transistor M5, and a gate connected to the output of clock inverter U1 to receive the inverted clock signal CPZ.

Fourth transmission gate 326 includes an n-channel transistor M7 which has a drain, a source connected to the source of transistor M5, and a gate connected to the output of clock inverter U1 to receive the inverted clock signal CPZ. Fourth transmission gate 326 also includes a p-channel transistor M8 which has a source connected to the drain of transistor M7, a drain connected to the source of transistor M7, and a gate connected to external clock input 314 to receive the clock signal CLK.

In addition to transmission gates 324 and 326, slave latch 312 also includes an inverter U4 and an inverter U5. Inverter U4 has an input connected to the source of transistor M5 and an output, while inverter U5 has an input connected to the output of inverter U4, and an output which generates the inverted flop signal QZ.

Slave latch 312 also includes an inverter U6 and an inverter U7. Inverter U6 has an input connected to the output of inverter U4, and an output connected to the drain of transistor M7. Inverter U7 has an input connected to the output of inverter U6, and an output which generates the flop data signal Q.

In operation, flop 300 attempts to generate complementary, symmetric outputs at Q and QZ by equalizing the propagation delay in two output signal paths. The first output signal path is from the input of inverter U4 to the output of inverter U5, ending with the inverted flop output signal QZ. The second output signal path is from the input of inverter U4, through inverters U6 and U7, ending with the flop output signal Q.

One problem with flop 300 is that the first output signal path contains two inverters (U4 and U5), while the second output signal path contains three inverters (U4, U6, and U7). Thus it is almost impossible to equalize the propagation delays of these two output signal paths over all process, voltage and temperature conditions (PVT conditions). The best that can be done is to equalize the path delays at one process corner, usually typical PVT, and then tolerate the delay changes, known as a timing skew, at the other process corners. Of course, this timing skew distorts the analog differential waveform between nodes N1 and N2 of interface 200.

FIG. 4 shows a timing diagram which illustrates the operation of a flip flop, such as flipflop 300, that has non-symmetric complementary outputs due to PVT induced timing skew.

Referring to FIG. 4, flip flop outputs Q and QZ are complementary outputs which have equal rise and fall times (equal to 2 time units). However, as shown in FIG. 4, data signal QZ changes state slightly before data signal Q (by one time unit), due to the previously described difference in path delay. Thus flip flop signals Q and QZ do not reach the power supply mid point voltage (VDD/2) at exactly the same time, resulting in signal asymmetry between Q and QZ. This signal asymmetry, due to timing skew, causes the differential analog output signal between nodes N1 and N2 in FIG. 2 to become distorted. This distortion is highly undesirable because it adversely affects the accuracy of the DAC analog output.

FIG. 5 shows the schematic diagram of a prior-art flip flop 500. Flop 500 illustrates a second implementation of flop FF1 in FIG. 2. Flop 500 is similar to flop 300 and, as a result, utilizes the same reference numerals to designate structures which are common to both flops. Referring to FIG. 5, Flop 500 differs from flop 300 in that flop 500 has a slave latch 510 which is different from slave latch 312.

As shown in FIG. 5, slave latch 510 contains several components which are also present, and identically connected, in slave latch 312. These components include transistors M5–M8 and inverters U4, U5 and U6.

Referring to FIG. 5, slave latch 512 includes a fifth transmission gate 528. Transmission gate 528 has an n-channel transistor M9 and a p-channel transistor M10. Transistor M9 has a drain connected to the input of inverter U6, a source which outputs the flop data signal Q, and a gate connected to external clock input 314 to receive the clock signal CLK. Transistor M10 has source connected to the drain of transistor M9, a drain connected to the source of transistor M9, and a gate connected to the output of clock inverter U1 to receive the inverted clock signal CPZ.

In operation, flop 500 attempts to obtain complementary, symmetric outputs by equalizing two propagation delays. The first propagation delay is from the output of inverter U4 to the output of inverter U5, ending with the inverted flop output signal QZ. The second propagation delay is from the output of inverter U4 to the output of transmission gate 528, ending with the flop output signal Q.

Although the delay through inverter U5 can be made equal to the delay through transmission gate 528 at one process corner, (usually typical PVT), the difference between these two delays will definitely change at other process corners.

Furthermore, the output impedance driving the inverse flop signal QZ is due to inverter U5, whereas the output impedance driving the flop signal Q is due to inverter U4 in series with transmission gate 528. Since it is virtually impossible to perfectly balance these two impedances under all PVT conditions, the differential analog waveform between nodes N1 and N2 of interface 200 will become distorted when non-typical PVT conditions are present.

As a result, there is a definite need for a flip flop which has complementary, symmetric outputs that have substantially zero timing skew, under all PVT conditions.

SUMMARY OF THE INVENTION

The flip flop of the present invention provides complementary, symmetric outputs which have substantially zero timing skew over all process, voltage and temperature conditions (PVT conditions). This is accomplished by utilizing a master latch to output a latched signal and an inverted latched signal, and a pair of slave latches to synchronize the latched signal and the inverted latched signal to the rising edge of the clock signal.

A flip flop in accordance with the present invention includes a first device which has a first input that receives a clock signal and a second input that receives a data signal. The first device also includes a first output which generates a first output signal, and a second output which generates an inverted first output signal. The clock signal alternates between a first logic state and a second logic state. The first device generates the first output signal with a logic state in response to the data signal when the clock signal is in the first logic state, and holds the logic state of the first output signal when the clock signal is in the second logic state. The first output signal is held by the first device in the state which was present when the clock signal transitioned from its first logic state to its second logic state.

The flip flop also includes a second device which has a third input that receives the clock signal, and a fourth input that receives the first output signal. The second device has a third output which generates a second output signal. The second device generates the second output signal with a logic state in response to the first output signal when the clock signal is in the second logic state, and holds the logic state of the second output signal when the clock signal is in the first logic state. The second output signal is held by the second device in the state which was present when the clock signal transitioned from its second logic state to its first logic state.

Furthermore, the flip flop also includes a third device which has a fifth input that receives the clock signal, and a sixth input that receives the inverted first output signal. The third device has a fourth output which generates an inverted second output signal. The third device generates the inverted second output signal with a logic state in response to the inverted first output signal when the clock signal is in the second logic state, and holds the logic state of the inverted second output signal when the clock signal is in the first logic state. The inverted second output signal is held by the third device to the state which was present when the clock signal transitioned from its second logic state to its first logic state.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
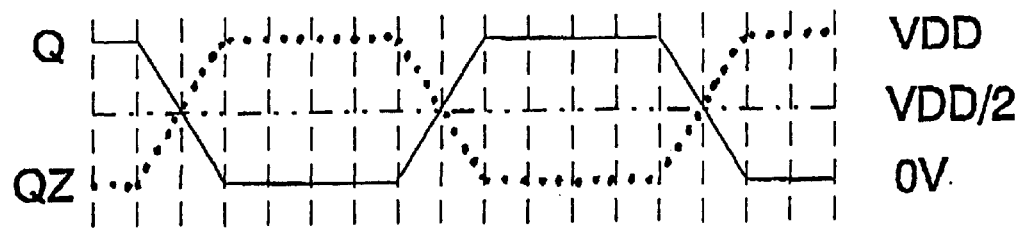
FIG. 1 is a timing diagram illustrating the operation of a flip flop with complementary, symmetric outputs.
Figure 2:
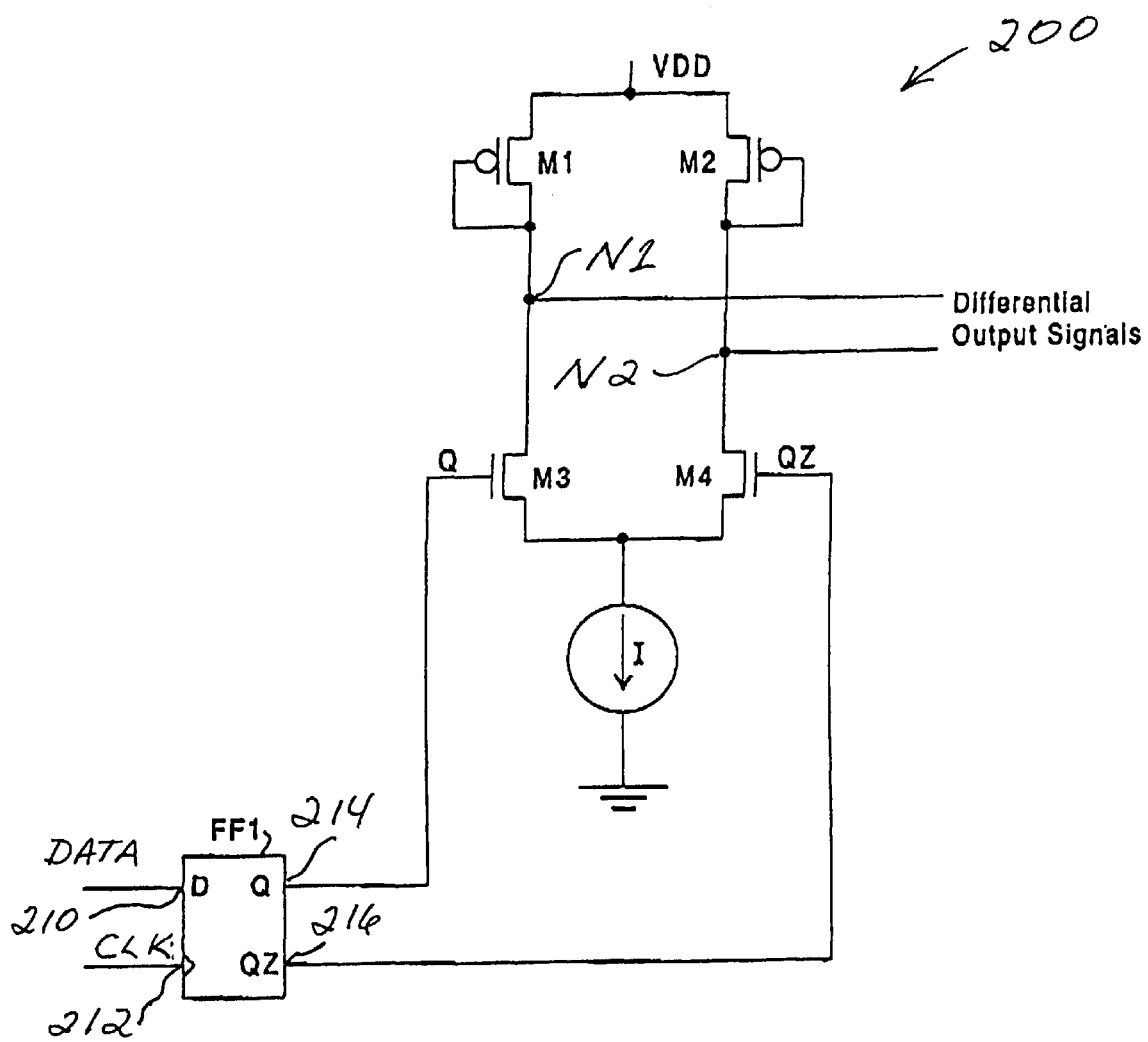
FIG. 2 is a schematic diagram illustrating a conventional digital-to-analog interface 200 for one bit of a high accuracy differential DAC.
Figure 3:
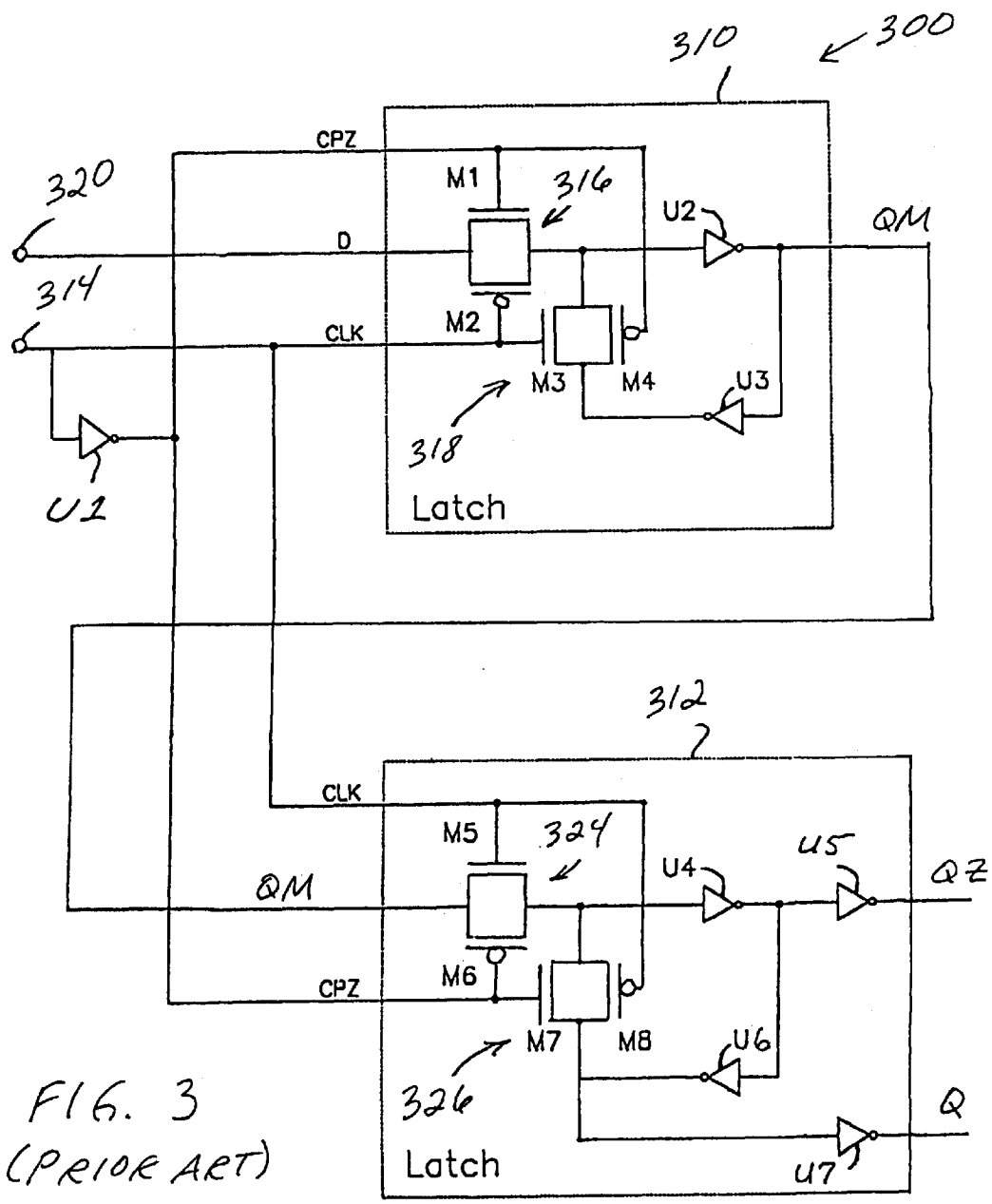
FIG. 3 is a schematic diagram of a prior art flip flop 300 illustrating a first implementation of flip flop FF1.
Figure 4:
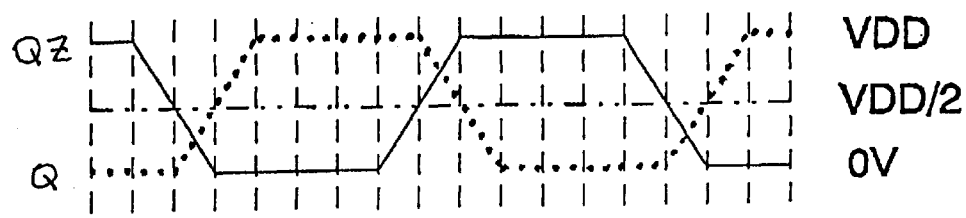
FIG. 4 is a timing diagram illustrating the operation of a flip flop, such as flip flop 300, which has complementary outputs that are non-symmetric due to PVT induced timing skew.
Figure 5:
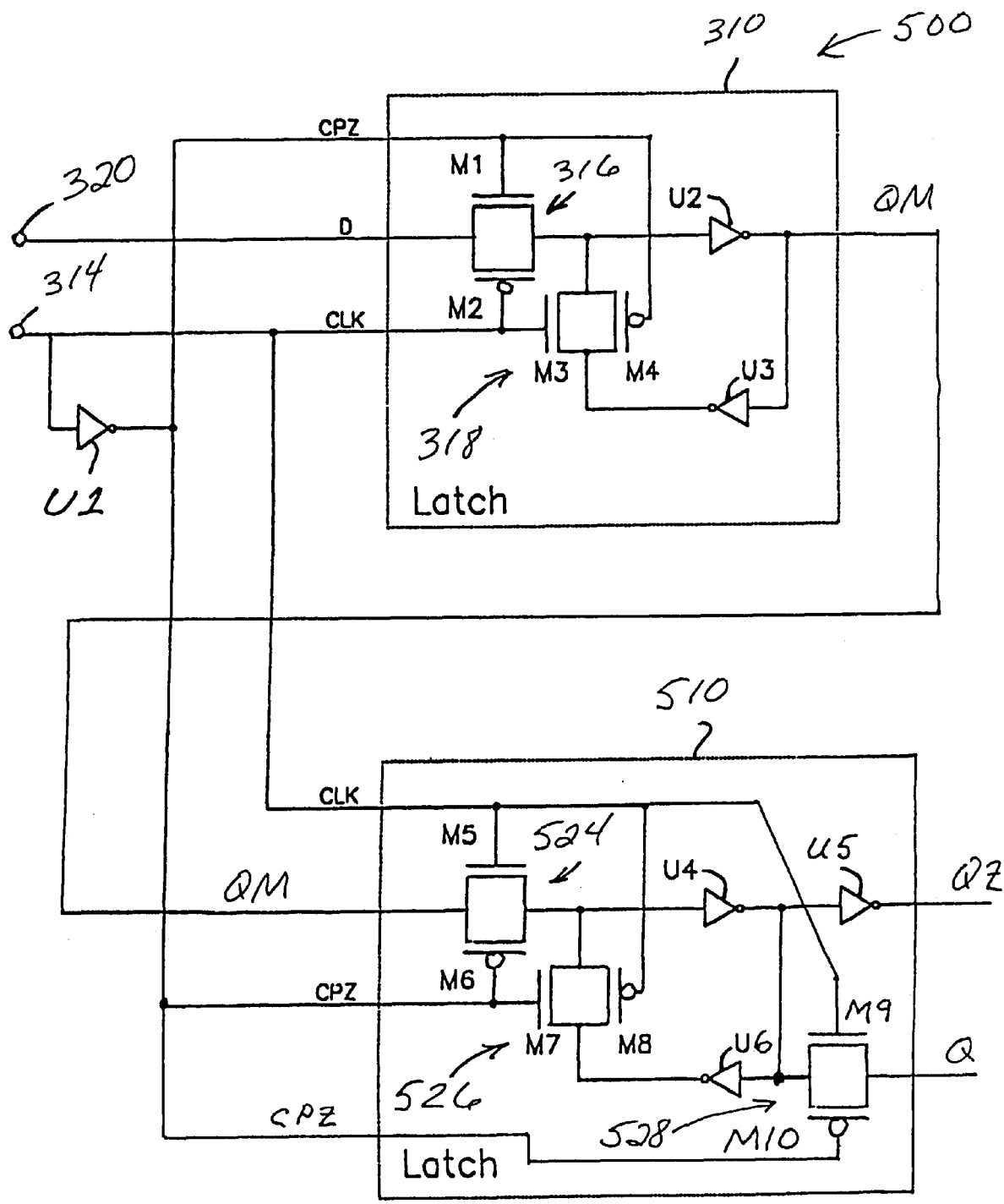
FIG. 5 is a schematic diagram of a prior-art flip flop 500 illustrating a second implementation of flop FF1.
Figure 6:
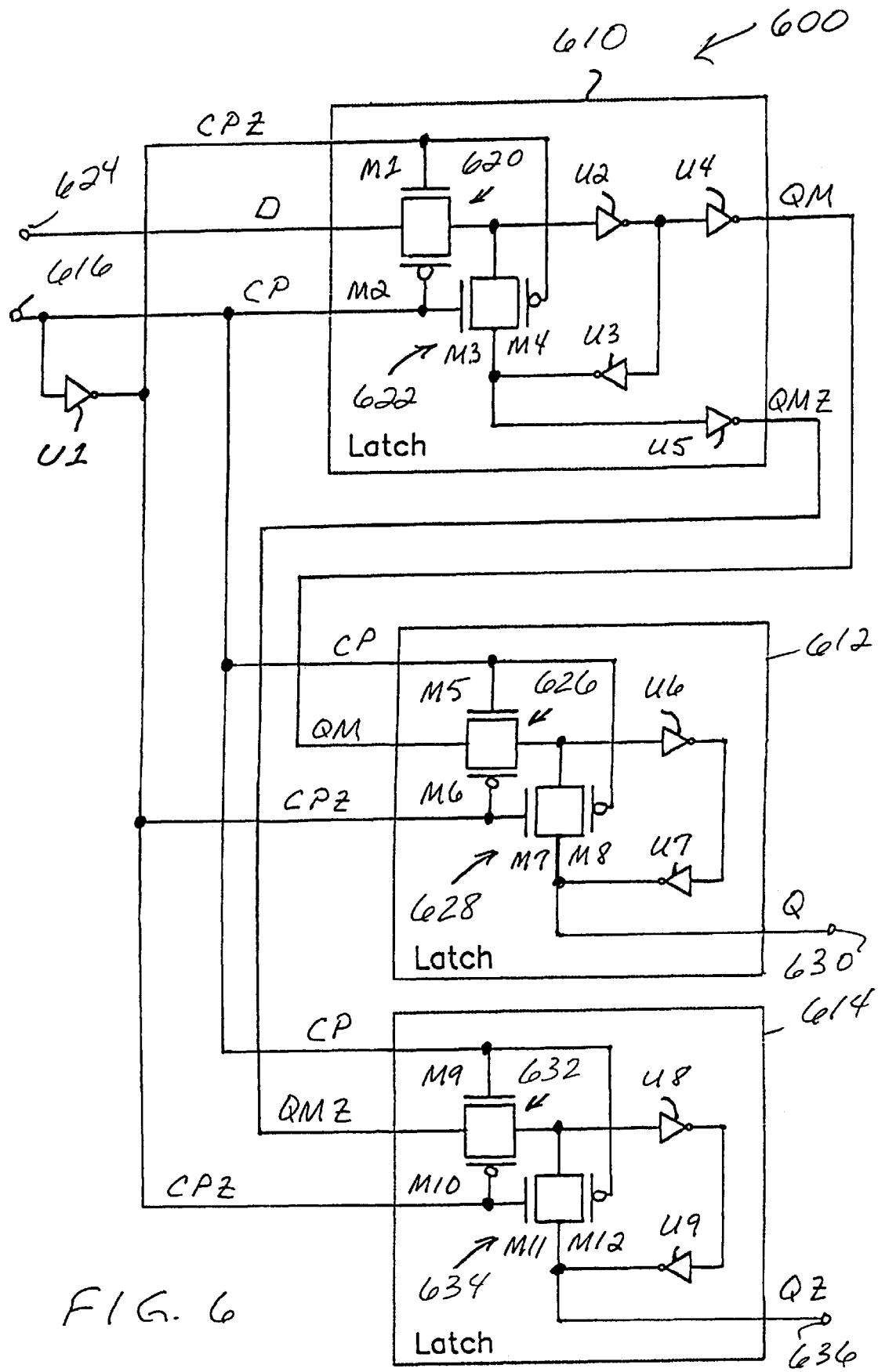
FIG. 6 is a schematic diagram illustrating a flip flop 600 in accordance with the present invention.

FIG. 6 shows the schematic diagram of a flip flop 600 in accordance with the present invention. As described in greater detail below, flop 600 provides complementary, symmetric outputs which have substantially zero timing skew over all process, voltage, and temperature conditions (PVT conditions). This is accomplished by utilizing a master latch and two identical slave latches, which synchronize two complementary data outputs from the master latch.

As shown in FIG. 6, flop 600 includes a clock inverter U1, a master latch 610, and two identical slave latches 612 and 614. Clock inverter U1 has an input connected to an external clock input 616 to receive a clock signal CP, and an output which generates an inverted clock signal CPZ.

Master latch 610 includes a first transmission gate 620 and a second transmission gate 622. First transmission gate 620 includes an n-channel transistor M1, which has a drain connected to an external data input 624 to receive a data signal D, a source, and a gate connected to the output of clock inverter U1 to receive the inverted clock signal CPZ. First transmission gate 620 also includes a p-channel transistor M2, which has a source connected to external data input 624 to receive the data signal D, a drain connected to the source of transistor M1, and a gate connected to external clock input 616 to receive the clock signal CP.

Second transmission gate 622 includes an n-channel transistor M3 which has a drain, a source connected to the source of transistor M1, and a gate connected to external clock input 616 to receive the clock signal CP. Second transmission gate 622 also includes a p-channel transistor M4, which has a source connected to the drain of transistor M3, a drain connected to the source of transistor M3, and a gate connected to the output of clock inverter U1 to receive the inverted clock signal CPZ.

In addition to first and second transmission gates 620 and 622, master latch 610 also includes an inverter U2, which has an input connected to the source of transistor M1, and an output. Furthermore, master latch 610 also includes an inverter U3, which has an input connected to the output of inverter U2, and an output connected to the drain of transistor M3.

Master latch 610 additionally includes an inverter U4, which has an input connected to the output of inverter U2, and an output which generates a latched output signal QM. Furthermore, master latch 610 also includes an inverter U5, which has an input connected to the output of inverter U3, and an output which generates an inverted latched output signal QMZ. Although latched signals QM and QMZ are logical complements of each other, they are not symmetric in the time domain because they do not change state at exactly the same time.

Referring to FIG. 6, inverters U4 and U5 are identical to each other. As a result, their corresponding device sizes are the same.

Slave latch 612 includes a third transmission gate 626 and a fourth transmission gate 628. Third transmission gate 626 includes an n-channel transistor M5 and a p-channel transistor M6. Transistor M5 has a drain connected to the output of inverter U4 to receive the latched signal QM, a source, and a gate connected to external clock input 616 to receive the clock signal CP. Transistor M6 has a source connected to the drain of transistor M5, a drain connected to the source of transistor M5, and a gate connected to the output of clock inverter U1 to receive the inverted clock signal CPZ.

Fourth transmission gate 628 includes an n-channel transistor M7 which has a drain, a source connected to the source of transistor M5, and a gate connected to the output of clock inverter U1 to receive the inverted clock signal CPZ. Fourth transmission gate 628 also includes a p-channel transistor M8 which has a source connected to drain of transistor M7, a drain connected to the source of transistor M7, and a gate connected to external clock input 616 to receive the clock signal CP.

In addition to transmission gates 626 and 628, slave latch 612 also includes an inverter U6 and an inverter U7. Inverter U6 has an input connected to the source of transistor M5 and an output. Furthermore, inverter U7 has an input connected to the output of inverter U6, and an output connected to the drain of transistor M7. The output of inverter U7 is also connected to an external output 630, generating the flop output signal Q.

Slave latch 614 includes a fifth transmission gate 632 and a sixth transmission gate 634. Fifth transmission gate 632 includes an n-channel transistor M9 and a p-channel transistor M10. Transistor M9 has a drain connected to the output of inverter U5 to receive the inverted latched signal QMZ, a source, and a gate connected to external clock input 616 to receive the clock signal CP. Transistor M10 has a source connected to the drain of transistor M9, a drain connected to the source of transistor M9, and a gate connected to the output of clock inverter U1 to receive the inverted clock signal CPZ.

Sixth transmission gate 634 includes an n-channel transistor M11 which has a drain, a source connected to the source of transistor M9, and a gate connected to the output of clock inverter U1 to receive the inverted clock signal CPZ. Sixth transmission gate 632 also includes a p-channel transistor M12 which has a source connected to drain of transistor M11, a drain connected to the source of transistor M11, and a gate connected to external clock input 616 to receive the clock signal CP.

In addition to transmission gates 632 and 634, slave latch 614 also includes an inverter U8 and an inverter U9. Inverter U8 has an input connected to the source of transistor M9 and an output. Furthermore, inverter U9 has an input connected to the output of inverter U8, and an output connected to the drain of transistor M11. The output of inverter U9 is also connected to an external inverted output 636, generating the inverted flop output signal QZ.

As noted above, in the example shown in FIG. 6, slave latches 612 and 614 are identical. In order to be identical, the widths and lengths of the following transistor pairs must be the same: M5/M9, M6/M10, M7/M11, and M8/M12. Similarly, the device sizes used in inverter U6 must be the same as the device sizes used in inverter U8. Furthermore, the device sizes used in inverter U7 must be the same as the device sizes used in inverter U9.

In operation, when the clock signal CP is a logic low, transmission gates 620, 628 and 634 are turned on, while transmission gates 622, 626 and 632 are turned off. As a result, the logic state of the data signal D on data input 624 propagates through transmission gate 620, inverter U2 and inverter U4, determining the logic state of the latched signal QM.

Similarly, the logic state of the data signal D on data input 624 propagates through transmission gate 620, inverter U2, inverter U3 and inverter U5, determining the logic state of the inverted latched signal QMZ. Thus, assuming adequate data set up time, inverters U2, U3, U4, and U5 will be in their non-changing steady state just before clock signal CP rises. As a result, the logic states of the latched signal QM and the inverted latched signal QMZ will be in their non-changing steady state just before clock signal CP rises.

When clock signal CP rises, transmission gates 620, 628 and 634 are turned off, and transmission gates 622, 626 and 632 are turned on. As a result, the logic state of the latched signal QM propagates through transmission gate 626, inverter U6 and inverter U7, determining the logic state of the latched signal Q.

Similarly, when clock signal CP rises, the logic state of the inverted latched signal QMZ propagates through transmission gate 632, inverter U8 and inverter U9, determining the logic state of the inverted latched signal QZ.

In accordance with the present invention, the signal path from the drain of M5 to latched signal Q is the same as the signal path from the drain of M9 to latched signal QZ. Furthermore, the load capacitance seen by inverter U4 is the same as the load capacitance seen by inverter U5. (This is true whether the clock is high or low). Thus, if the external load capacitances at Q and QZ are made equal, when clock signal CP rises, the latched signal QM and the inverted latched signal QMZ will change state at exactly the same time. Thus QM and QMZ will be mirror images of each other in the time domain, and they will not have any timing skew.

Referring to FIG. 6, it can be seen that when clock signal CP goes low, the signal path from D to QM passes through transmission gate 620 and two inverters, U2 and U4. Similarly, when clock signal CP goes low, the signal path from D to QMZ passes through transmission gate 620 and three inverters: U2, U3 and U5. Since these two signal paths contain an unequal number of inverters, the propagation delay from D to QM will not be the same as the propagation delay from D to QMZ. This propagation delay difference is not a problem, however, because it only occurs when clock signal CP goes low, not when CP goes high. Thus, as long as signals QM and QMZ reach their steady state condition before clock signal CP rises, signals Q and QZ will not have any timing skew.

When clock signal CP goes low, the propagation delay difference to QM/QMZ is not important because it simply amounts to a difference in setup time for slave latches 612 and 614. Thus, when clock signal CP rises, the signal delay through slave latches 612 and 614 will be the same. These latches only respond to signals QM and QMZ when clock signal CP rises, not when it falls.

Although FIG. 6 employs a rising edge triggered flip flop to illustrate the principles of the current invention, those skilled in the art will appreciate that the same principles can also be applied to falling edge triggered flipflops.

Figure 7:
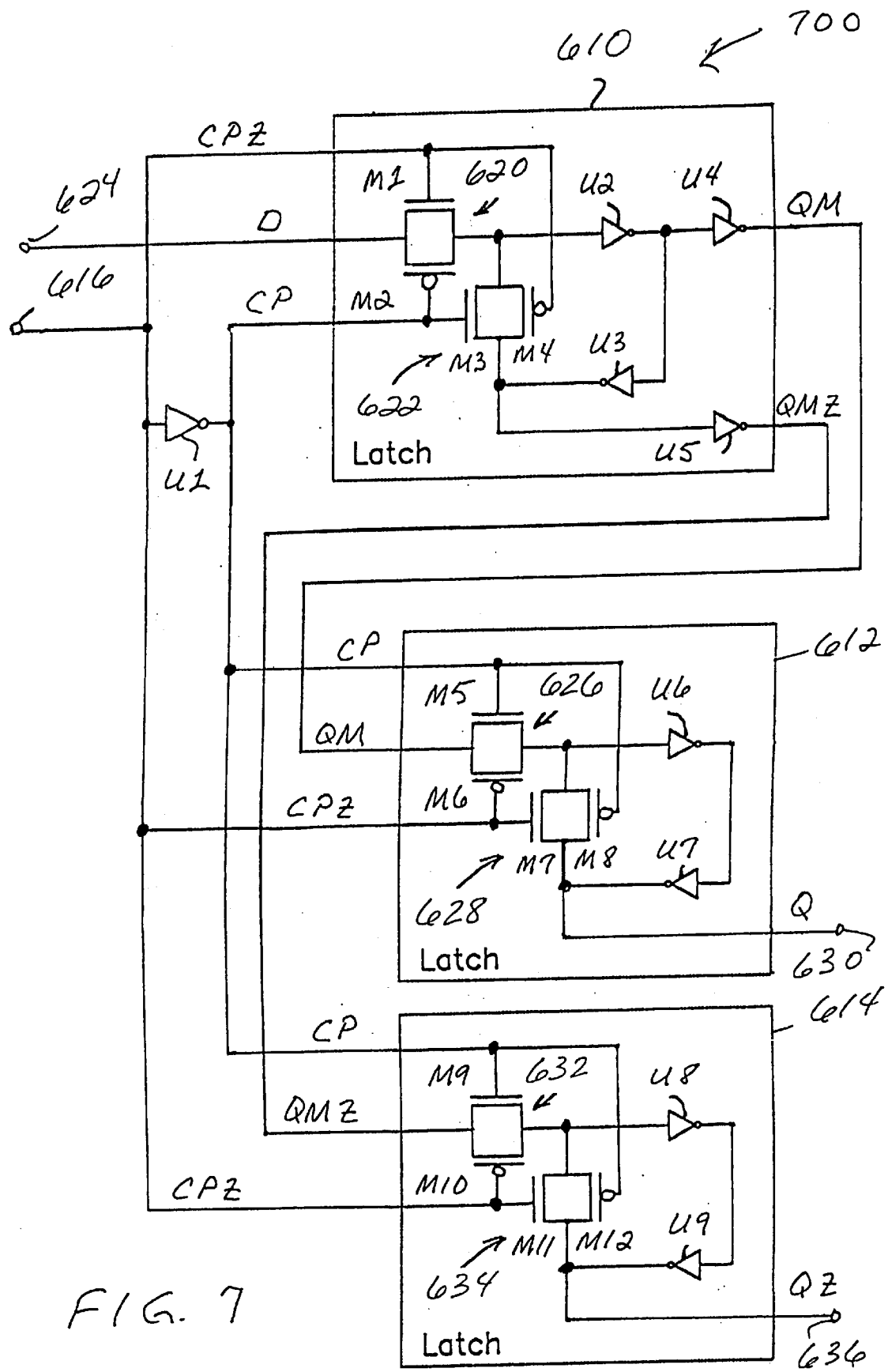
FIG. 7 is a schematic diagram illustrating a flip flop 700 in accordance with the present invention.
Figure 1:
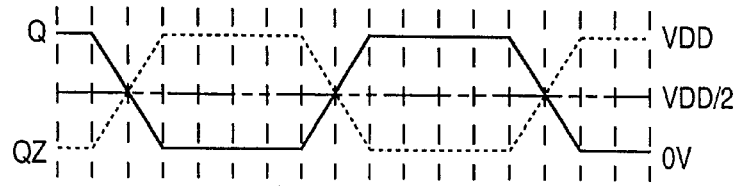
Figure 2:
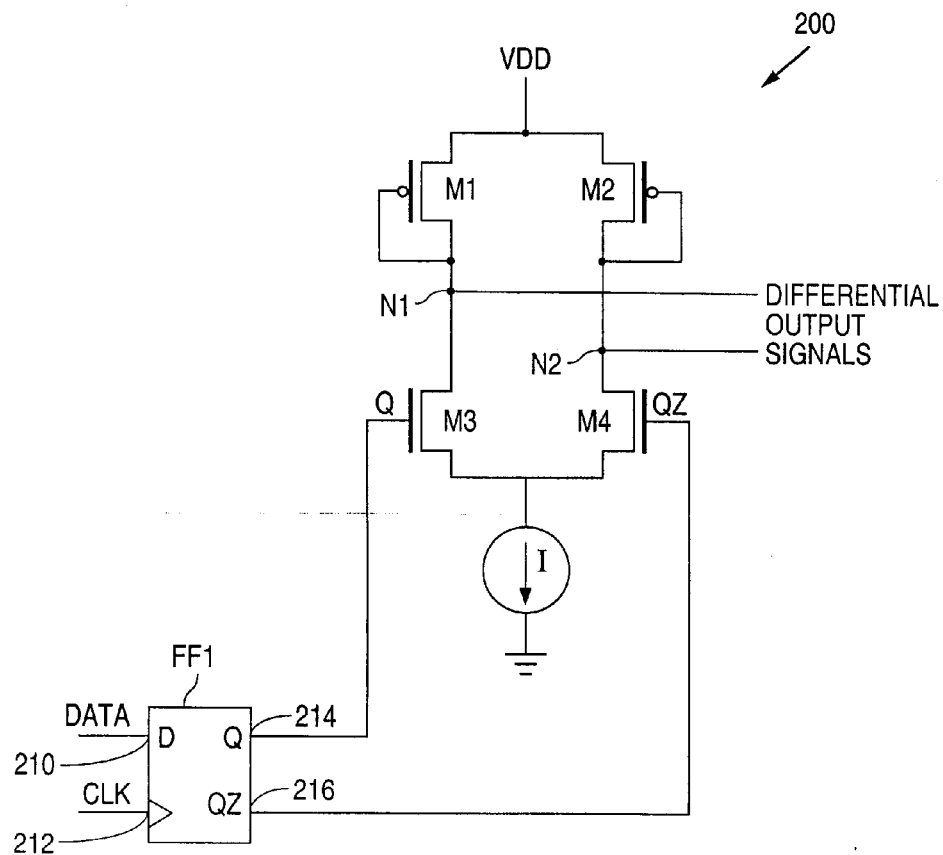
Figure 3:
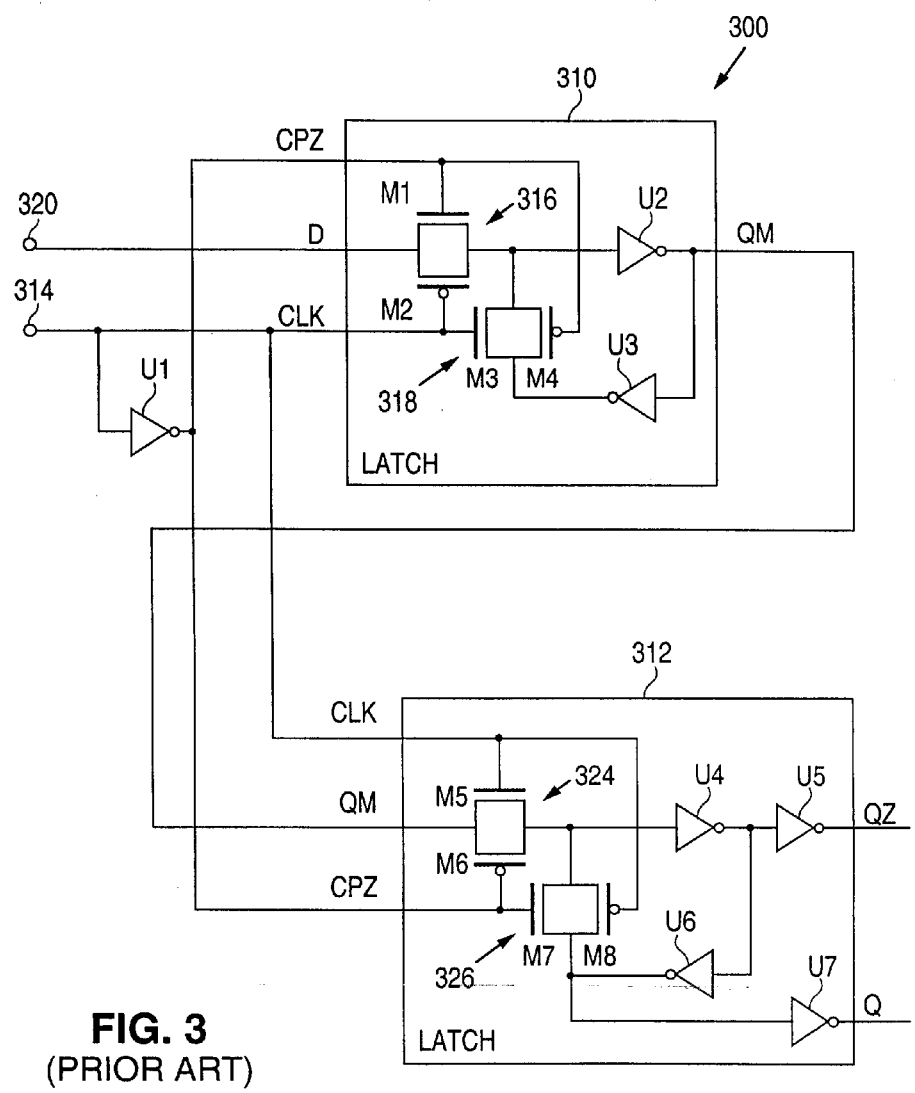
Figure 4:
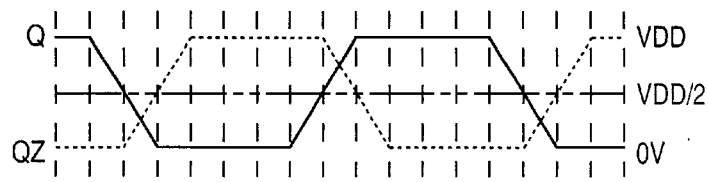
Figure 5:
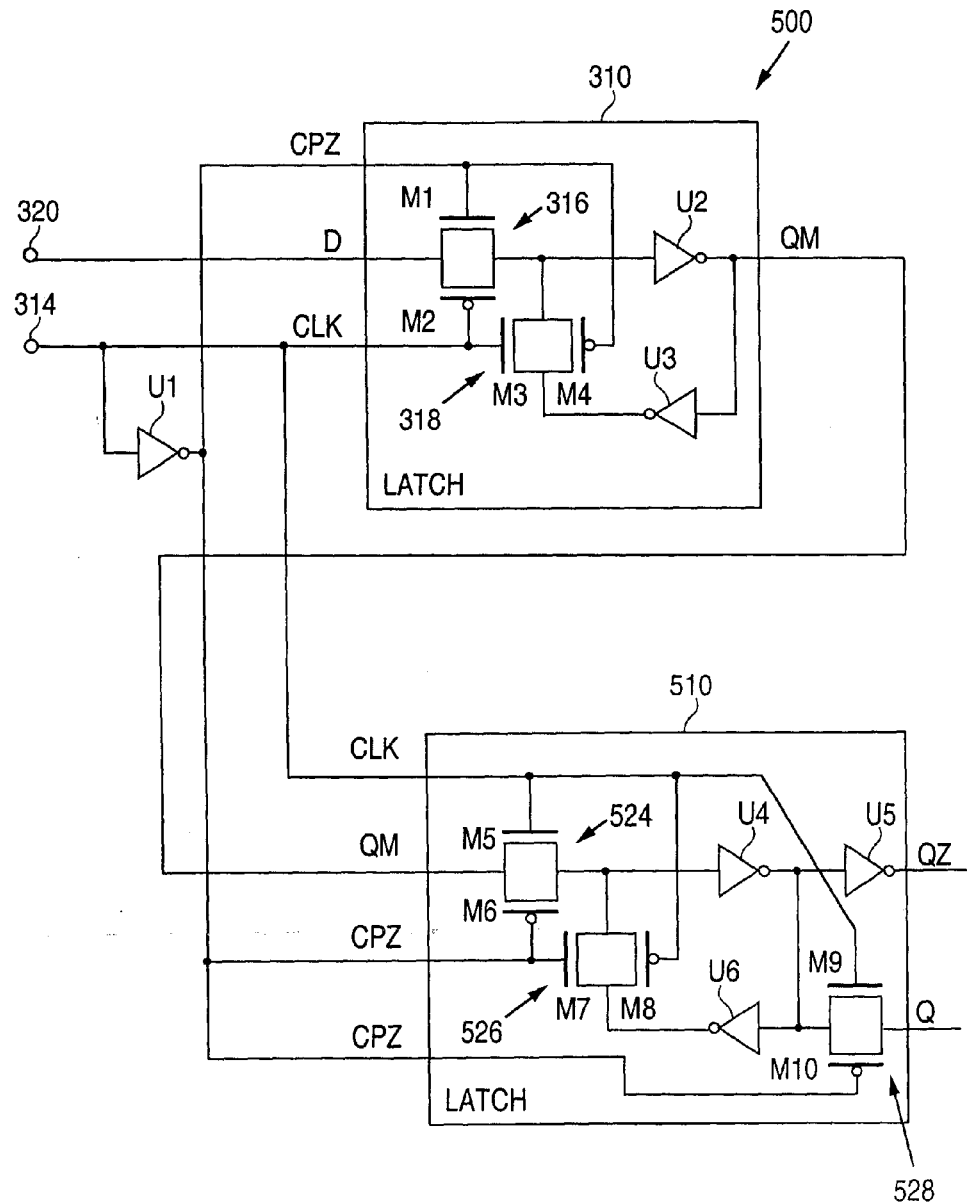
Figure 6:
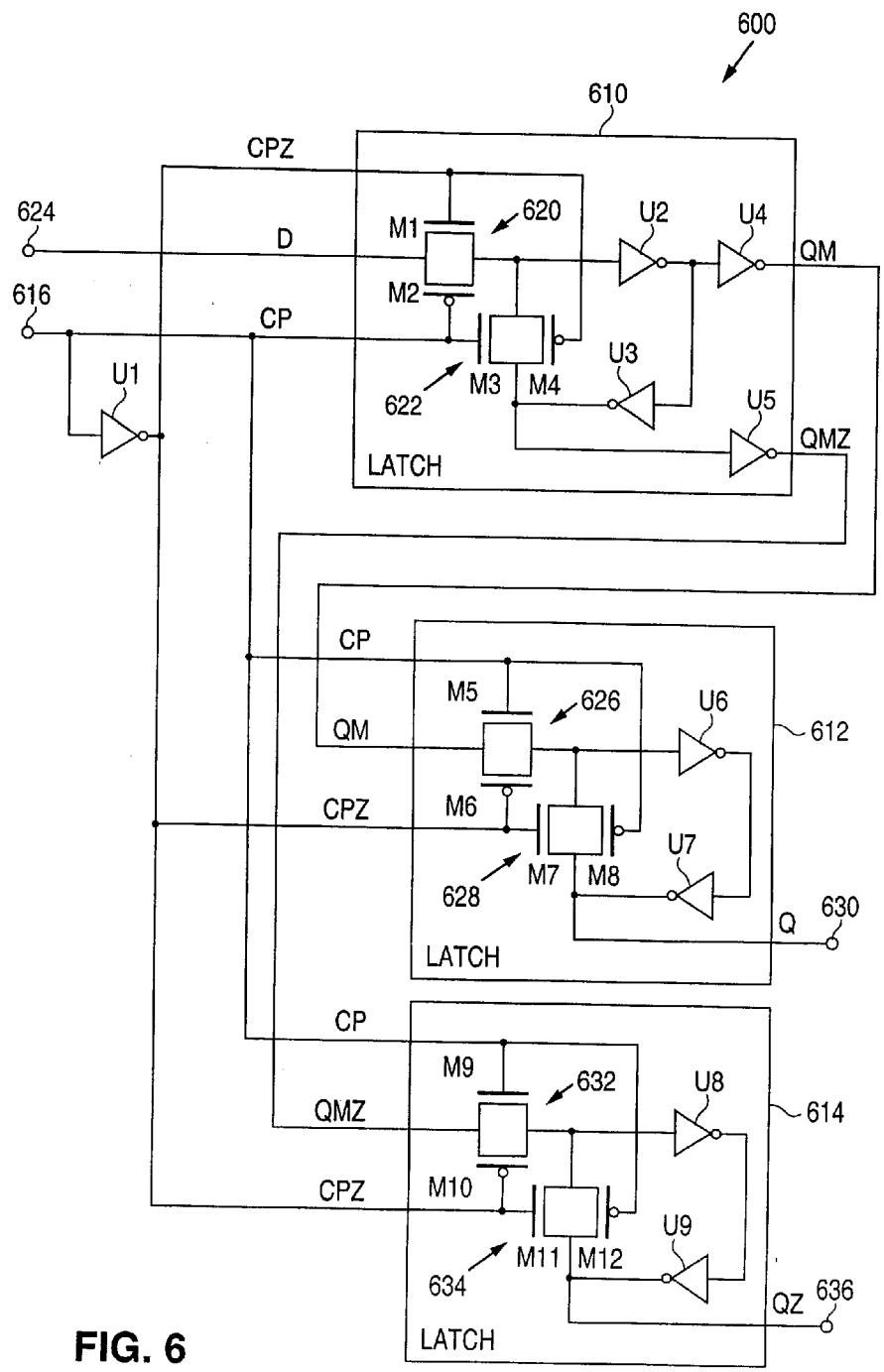
Figure 7:
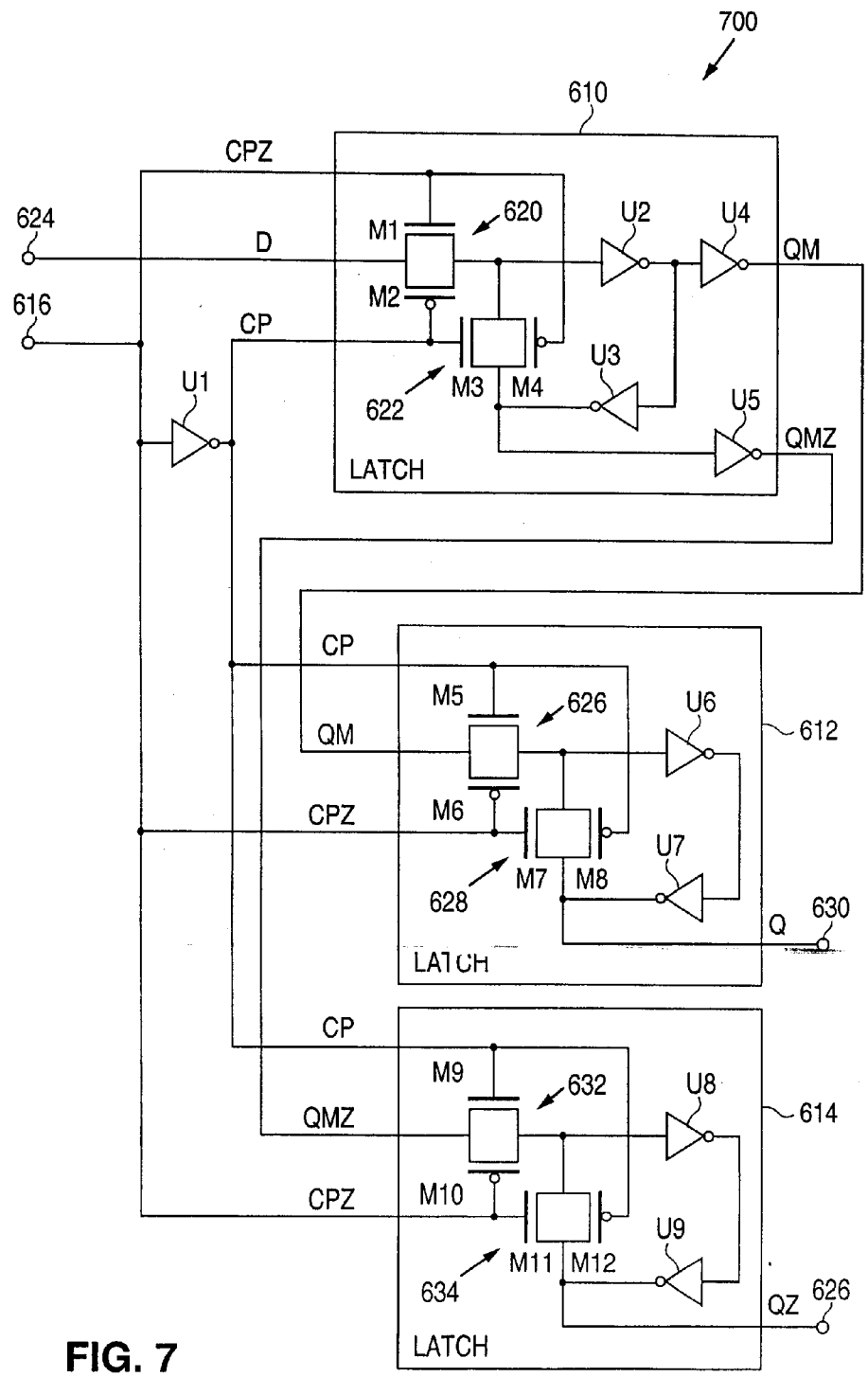

FIG. 7 shows the schematic diagram of a falling edge triggered flip flop 700 in accordance with the present invention. Flip flop 700 is similar to flip flop 600 and, as a result, utilizes the same reference numerals to designate the structures which are common to both flip flops.

Comparing FIG. 6 to FIG. 7, it can be seen that flip flop 600 is rising edge triggered because the clock input signal CP is being received at input 616, and the inverse clock signal CPZ is being generated at the output of inverter U1. Similarly, flip flop 700 is trailing edge triggered because the inverse clock signal CPZ is being received at input 616, and the clock signal CP is being generated at the output of inverter U1.

In summary, a flip flop which has complementary, symmetric, zero timing skew outputs has been described. By providing zero timing skew under all PVT conditions, the present invention allows higher accuracy DACs to be constructed.

It should be understood that various alternatives to the embodiment of the invention described herein may be employed in practicing the invention. Thus, it is intended that the following claims define the scope of the invention and that methods and structures within the scope of these claims and their equivalents be covered thereby.

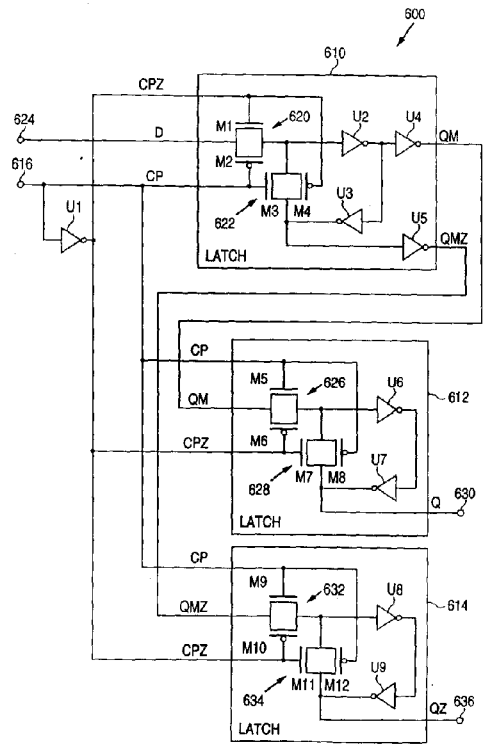

What is claimed is:

1. A flip flop comprising:
a first device having a first input that receives a clock signal and a second input that receives a data signal, the first device having a first output that outputs a first signal, and a second output that outputs an inverted first signal, the clock signal alternating between a first logic state and a second logic state, the first device outputting the first signal with a logic state in response to the data signal when the clock signal is in the first logic state, and holding the logic state of the first signal when the clock signal is in the second logic state, the first signal being held by the first device to a state that is present as the clock signal transitions from the first logic state to the second logic state;
a second device having a third input that receives the clock signal, and a fourth input that receives the first signal, the second device having a third output that outputs a second signal, the second device outputting the second signal with a logic state in response to the first signal when the clock signal is in the second logic state, and holding the logic state of the second signal when the clock signal is in the first logic state, the second signal being held by the second device to a state that is present when the clock signal transitions from the second logic state to the first logic state; and a third device having a fifth input that receives the clock signal, and a sixth input that receives the inverted first signal, the third device having a fourth output that outputs an inverted second signal, the third device outputting the inverted second signal with a logic state in response to the inverted first signal when the clock signal is in the second logic state, and holding the logic state of the inverted second signal when the clock signal is in the first logic state, the inverted second signal being held by the third device to a state that is present when the clock signal transitions from the second logic state to the first logic state.

2. The flip flop of claim 1 wherein the first device includes a first transmission gate that passes the data signal when the clock signal is in the first logic state, and blocks the data signal when the clock signal is in the second logic state.

3. The flip flop of claim 2 wherein the first device further includes:
- a first inverter having an input connected to an output of the first transmission gate, and an output;
- a second inverter having an input connected to the output of the first inverter, and an output that outputs the first signal;
- a third inverter having an input connected to the output of the first inverter, and an output;
- a fourth inverter having an input connected to the output of the third inverter, and an output that outputs the inverted first signal; and
- a second transmission gate connected to the input of the first inverter and the output of the third inverter.

4. The flip flop of claim 2 wherein the second device includes a second transmission gate that passes the first signal when the clock signal is in the second logic state, and blocks the first signal when the clock signal is in the first logic state.

5. The flip flop of claim 4 wherein the second device further includes:
- a first inverter having an input connected to an output of the second transmission gate, and an output;
- a second inverter having an input connected to the output of the first inverter, and an output that outputs the second signal; and
- a third transmission gate connected to the input of the first inverter and the output of the second inverter.

6. The flip flop of claim 4 wherein the third device includes a third transmission gate that passes the inverted first signal when the clock signal is in the second logic state, and blocks the inverted first signal when the clock signal is in the first logic state.

7. The flip flop of claim 5 wherein the third device further includes:
- a first inverter having an input connected to an output of the third transmission gate, and an output;
- a second inverter having an input connected to the output of the first inverter, and an output that outputs the inverted second signal; and
- a third transmission gate connected to the input of the first inverter and the output of the second inverter.

8. The flip flop of claim 1 wherein the second signal and the inverted second signal change logic states at substantially a same time.

9. The flip flop of claim 1
- wherein the second device and the third device are connected to a first supply voltage and a second supply voltage,
- wherein a mid-point voltage is equal to one-half the first supply voltage less the second supply voltage, and
- wherein the second signal and the inverted second signal reach the mid-point voltage at substantially a same time.

10. The flip flop of claim 1 wherein the first logic state of the clock signal is a logic high and the second logic state of the clock signal is a logic low.

11. The flip flop of claim 1 wherein the first logic state of the clock signal is a logic low and the second logic state of the clock signal is a logic high.

12. A flip flop comprising:
- a first inverter having an input connected to receive a first clock signal and an output that outputs a second clock signal, the second clock signal being inverted with respect to the first clock signal;
- a first latch having a first input connected to the first clock signal, a second input connected to a data signal, the first latch having a first output that outputs a latch signal, and a second output that outputs an inverted latch signal, the first clock signal alternating between a first logic state and a second logic state, the first latch outputting the latch signal with a logic state in response to the data signal when the first clock signal is in the first logic state, and holding the logic state of the latch signal to a state that is present as the first clock signal transitions from the first logic state to the second logic state when the first clock signal is in the second logic state;
- a second latch having a third input that receives the first clock signal, and a fourth input that receives the latch signal, the second latch having a third output that outputs a flop signal, the second latch outputting the flop signal with a logic state in response to the latch signal when the first clock signal is in the second logic state, and holding the logic state of the flop signal when the first clock signal is in the first logic state, the second signal being held by the second latch to a state that is present when the first clock signal transitions from the second logic state to the first logic state; and
- a third latch having a fifth input that receives the first clock signal, and a sixth input that receives the inverted latch signal, the third latch having a fourth output that outputs an inverted flop signal, the third latch outputting the inverted flop signal with a logic state in response to the inverted latch signal when the first clock signal is in the second logic state, and holding the logic state of the inverted flop signal when the first clock signal is in the first logic state, the inverted flop signal being held by the third latch to a state that is present when the first clock signal transitions from the second logic state to the first logic state.

13. The flip flop of claim 12 wherein the first latch includes a first transmission gate that passes the data signal when the first clock signal is in the first logic state, and blocks the data signal when the first clock signal is in the second logic state.

14. The flip flop of claim 13 wherein the first transmission gate includes:
- a n-channel transistor having a gate connected to the second clock signal; and
- a p-channel transistor connected to the n-channel transistor, the p-channel transistor having a gate connected to the first clock signal.

15. The flip flop of claim 14 wherein the first latch further includes:
- a second inverter having an input connected to an output of the first transmission gate, and an output;
- a third inverter having an input connected to the output of the second inverter, and an output that outputs the latch signal;
- a fourth inverter having an input connected to the output of the second inverter, and an output;
- a fifth inverter having an input connected to the output of the fourth inverter; and
- a second transmission gate connected to the input of the second inverter and the output of the fourth inverter, the second transmission gate having a third transistor having a gate connected to the first clock signal, and a fourth transistor connected to the third transistor, the fourth transistor having a gate connected to the second clock signal.

16. The flip flop of claim 13 wherein the second latch includes a second transmission gate that passes the latch signal when the first clock signal is in the second logic state, and blocks the latch signal when the first clock signal is in the first logic state.

17. The flip flop of claim 16 wherein the second transmission gate includes:
- a n-channel transistor having a gate connected to the first clock signal; and
- a p-channel transistor connected to the n-channel transistor, the p-channel transistor having a gate connected to the second clock signal.

18. The flip flop of claim 17 wherein the second latch further includes:
- a second inverter having an input connected to an output of the second transmission gate, and an output;
- a third inverter having an input connected to the output of the second inverter, and an output that outputs the flop signal; and
- a third transmission gate connected to the input of the second inverter and the output of the third inverter, the third transmission gate having a third transistor having a gate connected to the first clock signal, and a fourth transistor connected to the third transistor, the fourth transistor having a gate connected to the second clock signal.

19. The flip flop of claim 16 wherein the third latch includes a third transmission gate that passes the inverted latch signal when the first clock signal is in the second logic state, and blocks the inverted latch signal when the first clock signal is in the first logic state.

20. The flip flop of claim 19 wherein the third transmission gate includes:
- a n-channel transistor having a gate connected to the first clock signal; and
- a p-channel transistor connected to the n-channel transistor, the p-channel transistor having a gate connected to the second clock signal.

21. The flip flop of claim 19 wherein the third latch further includes:
- a second inverter having an input connected to an output of the third transmission gate, and an output;
- a third inverter having an input connected to the output of the second inverter, and an output that outputs the inverted flop signal; and
- a fourth transmission gate connected to the input of the second inverter and the output of the third inverter, the fourth transmission gate having a third transistor having a gate connected to the first clock signal, and a fourth transistor connected to the third transistor, the fourth transistor having a gate connected to the second clock signal.

22. The flip flop of claim 12 wherein the flop signal and the inverted flop signal change logic states at substantially a same time.

23. The flip flop of claim 14 wherein the first inverter has an output connected to the n-channel transistor.

24. The flip flop of claim 14 wherein the first inverter has an input connected to the p-channel transistor.

25. The flip flop of claim 12 wherein the first logic state of the first clock signal is a logic high and the second logic state of the first clock signal is a logic low.

26. The flip flop of claim 12 wherein the first logic state of the first clock signal is a logic low and the second logic state of the first clock signal is a logic high.

* * * * *

UNITED STATES PATENT AND TRADEMARK OFFICE
CERTIFICATE OF CORRECTION

PATENT NO.    : 6,492,855 B1
DATED         : December 10, 2002
INVENTOR(S)   : Pasqualini It is certified that error appears in the above-identified patent and that said Letters Patent is hereby corrected as shown below:

The title page, showing the illustrative figure should be deleted, and substituted therefore the new title page with the illustrated figure attached The drawing sheets consisting of figures 1-7 should be deleted, to be replaced with the drawings sheets cosisting of figures 1-7, as shown on the attached sheets.

Signed and Sealed this

Fifteenth Day of April, 2003

JAMES E. ROGAN
*Director of the United States Patent and Trademark Office*

(12) United States Patent
Pasqualini

(10) Patent No.: US 6,492,855 B1
(45) Date of Patent: Dec. 10, 2002

(54) FLIP FLOP WHICH HAS COMPLEMENTARY, SYMMETRIC, MINIMAL TIMING SKEW OUTPUTS

(75) Inventor: Ronald Pasqualini, Los Altos, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/950,207

(22) Filed: Sep. 10, 2001

(51) Int. Cl.$^7$ ............................................. H03K 3/356
(52) U.S. Cl. ................................. 327/211; 327/212
(58) Field of Search ............................. 327/199–203, 327/206, 208, 210–215, 218, 219

(56) References Cited

U.S. PATENT DOCUMENTS

| | | | | |
|---|---|---|---|---|
| 5,598,120 A | * | 1/1997 | Yurash | 327/144 |
| 6,064,246 A | * | 5/2000 | Endo et al. | 327/202 |
| 6,127,867 A | * | 10/2000 | Coughlin et al. | 327/202 |
| 6,239,640 B1 | * | 5/2001 | Liao et al. | 327/211 |
| 6,242,958 B1 | * | 6/2001 | Fletcher | 327/201 |

* cited by examiner

*Primary Examiner*—My-Trang Nu Ton
(74) *Attorney, Agent, or Firm*—Mark C. Pickering

(57) ABSTRACT

The complementary outputs of a master slave flip flop are made symmetric, with substantially zero timing skew over all process, voltage and temperature conditions. This is accomplished by utilizing a master latch and a pair of identical slave latches. Although the complementary outputs from the master latch have non-zero timing skew when the clock goes low, they have zero timing skew when the clock goes high. Thus the identical slave latches, whose outputs react to the master latch outputs only when the clock goes high, do not have any timing skew.

26 Claims, 5 Drawing Sheets